United States Patent [19]
Kuwabara

[11] Patent Number: 5,433,813
[45] Date of Patent: Jul. 18, 1995

[54] SEMICONDUCTOR DEVICE MANUFACTURING APPARATUS

[75] Inventor: Hideshi Kuwabara, Zama, Japan

[73] Assignee: Canon Kabushiki Kaisha, Tokyo, Japan

[21] Appl. No.: 145,150

[22] Filed: Nov. 3, 1993

[30] Foreign Application Priority Data

Nov. 12, 1992 [JP] Japan .................................. 4-302225

[51] Int. Cl.$^6$ ......................... H01L 21/00; C23C 16/00
[52] U.S. Cl. .................... 156/345; 118/723 E; 118/723 MW; 118/723 MR; 118/723 AN; 118/723 R; 118/666; 216/61
[58] Field of Search ..... 118/723 E, 723 ER, 723 MP, 118/666, 723 R, 723 MW, 723 ME, 723 MR, 723 MA, 723 AN; 156/345, 626, 627; 204/298.03, 298.32

[56] References Cited

U.S. PATENT DOCUMENTS 5,231,690 7/1993 Soma et al. ................... 118/725 X
5,232,509 8/1993 Min et al. ..................... 118/723 E

OTHER PUBLICATIONS

"The Study of Semiconductor," Edited by Nishizawa, Kogyo Chosakai, vol. 17, p. 227 et seq.

Primary Examiner—R. Bruce Breneman
Assistant Examiner—Jonathan D. Baskin
Attorney, Agent, or Firm—Fitzpatrick, Cella, Harper & Scinto

[57] ABSTRACT

In a semiconductor device manufacturing apparatus of a reactive ion etching apparatus or the like, only a DC signal in a high frequency electric field can be accurately detected in a real-time manner without any noise, thereby enabling a temperature, a potential, or another parameter of a substrate (wafer) to be accurately measured. For this purpose, according to this manufacturing apparatus, a transmission line filter (coaxial cable) 8 having an electric length $((2n+1)\lambda/4)$ that is an odd-number times as long as $\frac{1}{4}$ of the wavelength $\lambda$ of a high frequency power source 1 is connected between a thermocouple or electrode 7 and a voltmeter 10 to measure a temperature or another parameter of a wafer (substrate) 5. A high frequency signal is separated by the transmission line filter, and a high frequency impedance is short-circuited by a capacitance 9 resulting in the high frequency component being removed, and only a DC signal being provided to the voltmeter 10.

11 Claims, 3 Drawing Sheets $Z_0$: CHARACTERISTIC IMPEDANCE
$Z$: LOAD IMPEDANCE

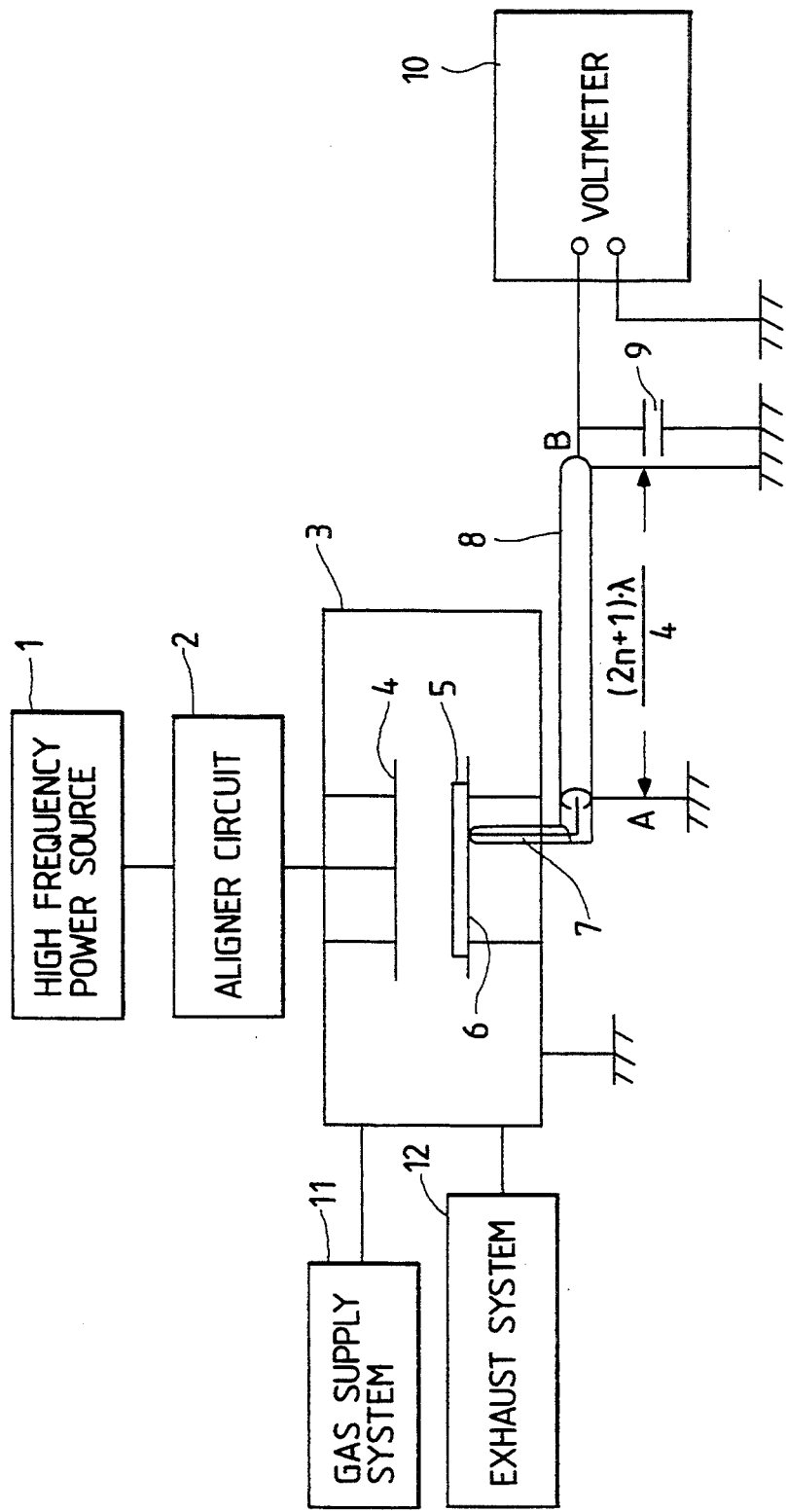

SEMICONDUCTOR DEVICE MANUFACTURING APPARATUS

BACKGROUND OF THE INVENTION

1. Field of the Invention

The invention relates to a semiconductor device manufacturing apparatus for heating or producing a plasma by a high frequency (also including a microwave) electric power.

2. Related Background Art

It is known, for example, as disclosed in "The Study of Semiconductor", edited by Nishizawa, Kogyo Chosa Kai, Vol. 17, page 227 that, a semiconductor device manufacturing apparatus using a high frequency discharge represented by a reactive ion etching (RIE) apparatus is ordinarily constructed in a manner such that a wafer (substrate) for a semiconductor device is exposed to a plasma which is generated by a high frequency electric power. According to such a manufacturing apparatus, a substrate temperature and a substrate potential, as important parameters of the semiconductor processes, are monitored by a simple thermocouple and an electric wire.

According to the conventional apparatus as mentioned above, however, since both of the thermocouple and a susceptor are also exposed to the high frequency electric field together with a wafer, there is a drawback such that it is difficult to accurately perform a measurement. Namely, the temperature and potential of the substrate are generally measured by a voltmeter having a large input impedance. That is, the thermocouple on the input side of the voltmeter or a substrate potential measuring electrode exhibits a high impedance. It is well known that when a portion of a high impedance exists in the high frequency electric field as mentioned above, a large potential change occurs only in the case where only a slight high frequency current flows. Therefore, in order to reduce the high frequency impedance, for example, the use of a low pass filter by a concentrated constant circuit, comprising an inductance (coils $L_1$ to $L_3$) and capacitances ($C_1$ to $C_3$) as shown in FIG. 1 has been used. However, the correct effect is not always obtained. In other words, according to an LC filter by the conventional concentrated constant circuit (inductances, capacitances), it is very difficult to form a filter which exhibits the largest attenuation or high isolation at a frequency f of a high frequency power source. Particularly, when the frequency f lies within a range from 10 MHz to 1 GHz, the circuit itself lies within a region where it changes from the concentrated constant circuit to the distributed constant circuit, and it is necessary to consider influences by both of them.

SUMMARY OF THE INVENTION

It is an object of the invention to provide a semiconductor device manufacturing apparatus which can solve the problems as mentioned above and can accurately measure a substrate temperature, a substrate potential, or another substrate parameter.

Another object of the invention is to provide a semiconductor device manufacturing apparatus such as a reactive ion etching apparatus or the like, in which only a DC signal in a high frequency electric field can be accurately detected in a real-time manner and a temperature, a potential, or another parameter of a substrate (wafer) can be accurately measured.

BRIEF DESCRIPTION OF THE DRAWINGS

FIG. 2 is a constructional diagram showing a schematic construction of a semiconductor device manufacturing apparatus of a first embodiment of the invention;

DETAILED DESCRIPTION OF THE PREFERRED EMBODIMENTS

Figure 1:
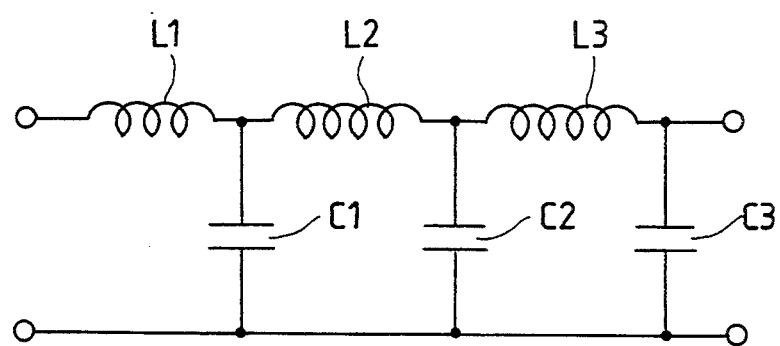
FIG. 1 is a circuit diagram showing a low pass filter according to a conventional concentrated constant circuit.

The above objects can be accomplished by a semiconductor device manufacturing apparatus comprising: a high frequency power source to generate a high frequency of a wavelength λ; a thermocouple or electrode to detect a temperature, a potential, or the like of a wafer for a semiconductor device placed in an electric field of the high frequency; a measuring system to measure the temperature, potential, or the like through the thermocouple or electrode; and a transmission line filter which is connected between the thermocouple or electrode and the measuring system and has an electric length which is an odd-number times as long as ¼ of the wavelength λ.

In the semiconductor device manufacturing apparatus of the invention, it is preferable that a capacitance to eliminate a high frequency impedance is connected to the transmission line filter.

As mentioned above, the transmission line of a length that is odd-number times as long as the ¼ wavelength which was formed by using a distributed constant line is connected between the thermocouple (or electrode) and the measuring instrument, so that the high frequency signal and the DC signal can be separated, and the substrate potential, substrate temperature, and the other physical parameters can be accurately measured.

A preferred embodiment of the invention will now be described in detail hereinbelow with reference to the drawings.

FIG. 2 shows a schematic construction of a semiconductor device manufacturing apparatus (RF sputtering apparatus) of the first embodiment of the invention. In the diagram, reference numeral 1 denotes a high frequency power source of a frequency f and a wavelength λ; 2 an aligner circuit to align an output of the high frequency power source 1; 3 a vacuum chamber; 4 an electrode (cathode) to which a high frequency electric power is supplied from the high frequency power source 1 through the aligner circuit 2; 5 a wafer (substrate) for a semiconductor device which is arranged so as to face the electrode 4; 6 an opposite electrode (anode) of the electrode 4; and 7 a sheathed type thermocouple arranged on the rear side of the opposite electrode 6. The above component parts 4 to 7 are provided in the vacuum chamber 3. Reference numeral 8 denotes a coaxial cable having a characteristic impedance of 50 Ω. An electric length of the coaxial cable 8 is odd number times (namely, $(2n+1)\lambda/4$) as long as ¼ of the wavelength λ of the high frequency power source 1. Reference numeral 9 denotes a capacitance which is connected between a rear edge portion of the coaxial cable 8 and the ground potential. A plurality of capacitances 9 are radially symmetrically arranged with respect to a core line of the coaxial cable 8 as shown by a low impedance (for example, 0.1 Ω or less) at the frequency f of the high frequency power source 1. Reference numeral 10 denotes a voltmeter as a measuring system which is connected to the thermocouple 7 through the coaxial cable 8; 11 a gas supply system to supply a predetermined gas into the vacuum chamber 3; and 12 an exhaust system to exhaust the gas in the vacuum chamber 3. A covered wire of the coaxial cable 8 is connected to the ground on the vacuum chamber side and the measuring system side.

In the construction of FIG. 2, the gas introduced from the gas supply system 11 is exhausted to a level of $10^{-2}$ to $10^{-4}$ Torr by the exhaust system 12. In this state, when a high frequency electric power is applied from the high frequency power source 1, a plasma is generated in the vacuum chamber 3. The temperature and potential of the wafer 5 at this time are important parameters of the plasma process and it is demanded that they are monitored in a real-time manner. For this purpose, in a state in which the plasma is generated, it is important to stably measure a DC voltage.

Figure 3:
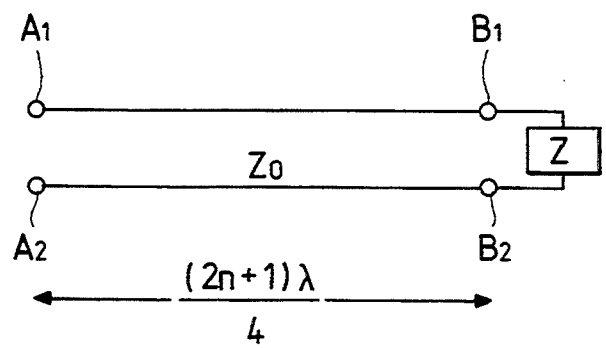
FIG. 3 is a diagram showing an equivalent circuit of a ¼ wavelength transmission circuit according to the invention.

FIG. 3 shows the principle of the measurement of the invention and shows an equivalent circuit of the coaxial cable 8 as a ¼ wavelength transmission line. ($A_1$ and $A_2$) and ($B_1$ and $B_2$) in FIG. 3 correspond to both ends A and B of the coaxial cable 8 in FIG. 2, respectively. $Z_0$ denotes a characteristic impedance of the transmission line and Z indicates a load impedance thereof. In case of a load (Z=0) such that an impedance at a time point when a load is seen from ($B_1$-$B_2$) at the frequency f is equal to 0 Ω, an impedance when the load is seen from ($A_1$-$A_2$) is set to ∞. Such a phenomenon is a well-known fact in the high frequency transmission circuit art.

In the embodiment, the high frequency impedance in the edge portion B is reduced (short-circuited) by the capacitance 9 in FIG. 2, thereby removing the high frequency component. Thus, only the DC signal is sent to the voltmeter 10.

Specifically speaking, in case of using a high frequency of 100 MHz, it is sufficient to set the electric length to 50 cm.

(Another Embodiment)

Figure 4:
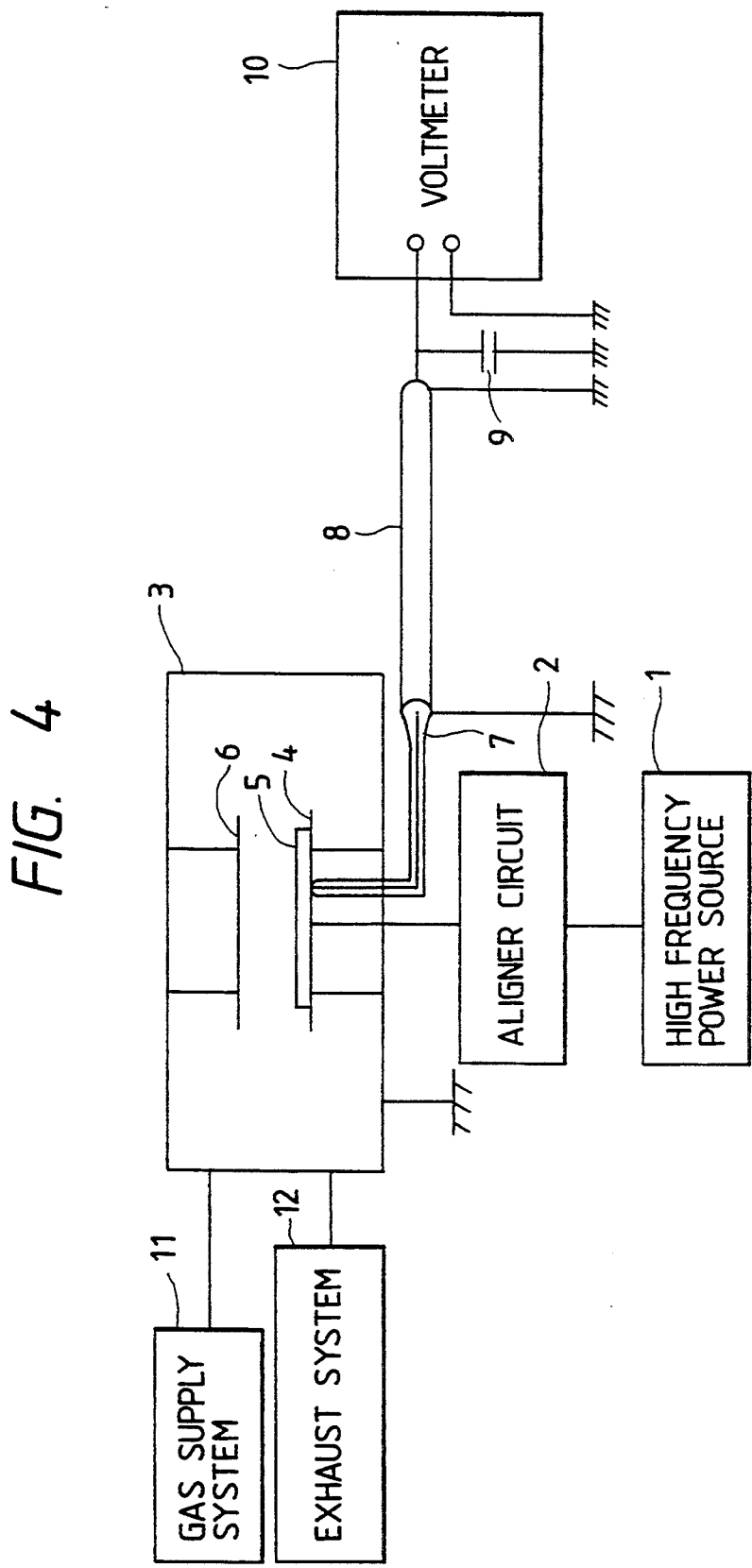
FIG. 4 is a constructional diagram showing a schematic construction of a semiconductor device manufacturing apparatus of a second embodiment of the invention.

FIG. 4 shows a schematic construction of a semiconductor device manufacturing apparatus (RIE apparatus) of the second embodiment of the invention. Reference numerals 1 to 12 designate the same component elements as those in the first embodiment of FIG. 2.

There is a constructional difference between the first and second embodiments with respect to the position of the wafer 5. That is, although the wafer 5 is placed on the anode 6 in the first embodiment, it is placed on the cathode 4 in the second embodiment. The operation and effect on measurement in the second embodiment are quite similar to those in the first embodiment.

As described above, according to the invention, since the high frequency impedance is reduced by using the ¼ wavelength transmission line, noise is prevented and a typical effect such that only the DC signal in the high frequency electric field can be accurately detected in a real-time manner is obtained.

In the ¼ wavelength transmission line of the invention, since the frequency which provides the maximum isolation is determined by only the electric length of the transmission line, there are special advantages such that the semiconductor device can be very easily manufactured and it is sufficient to use a small space for such a device. Such advantages cannot be obtained by a conventional technique like, for example, an LC filter by the concentrated constant circuit in FIG. 1.

What is claimed is:

1. A semiconductor device manufacturing apparatus comprising:
   a high frequency power source to generate a high frequency wave of a wavelength λ;
   a thermocouple or an electrode to detect a temperature or a potential of a wafer for a semiconductor device placed in an electric field of the high frequency wave;
   a measuring system to measure the temperature or potential through said thermocouple or electrode; and
   a transmission line filter which is connected between said thermocouple or electrode and said measuring system and which has an electric length that is an odd-number times as long as ¼ of the wavelength λ.

2. An apparatus according to claim 1, wherein a capacitor having first and second electrodes has the first electrode connected to said transmission line filter.

3. An apparatus according to claim 2, wherein said capacitor is provided to eliminate a high frequency impedance.

4. An apparatus according to claim 1, wherein said transmission line filter includes a coaxial cable.

5. An apparatus according to claim 2, wherein the second electrode of said capacitor is connected to an edge portion on said measuring system side of said transmission line filter, which filter includes a coaxial cable.

6. An apparatus according to claim 5, wherein a plurality of capacitors are provided.

7. An apparatus according to claim 6, wherein said plurality of capacitors are radially provided with respect to a core wire of said coaxial cable.

8. An apparatus according to claim 4, wherein said plurality of capacitors are symmetrically arranged.

9. An apparatus according to claim 4, wherein a covered wire of said coaxial cable is connected to a ground.

10. An apparatus according to claim 9, wherein the covered wire is connected to the ground at a plurality of positions.

11. An apparatus according to claim 10, wherein the connections to the ground are made in edge portions on opposite ends of said coaxial cable.

* * * * *

UNITED STATES PATENT AND TRADEMARK OFFICE
CERTIFICATE OF CORRECTION

PATENT NO. : 5,433,813
DATED : July 18, 1995
INVENTOR(S) : Hideshi Kuwabara

It is certified that error appears in the above-indentified patent and that said Letters Patent is hereby corrected as shown below:

Column 1, line 42, " , comprising" should read -- comprising--.

Signed and Sealed this

Third Day of October, 1995

Attest:

BRUCE LEHMAN

*Attesting Officer*     *Commissioner of Patents and Trademarks*